(12) United States Patent
Jin et al.

(10) Patent No.: US 10,804,491 B2
(45) Date of Patent: Oct. 13, 2020

(54) ORGANIC LIGHT EMITTING DIODE DISPLAY DEVICE

(71) Applicant: Wuhan China Star Optoelectronics Semiconductor Display Technology Co., Ltd., Wuhan (CN)

(72) Inventors: Jiangjiang Jin, Wuhan (CN); Hsianglun Hsu, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 2 days.

(21) Appl. No.: 16/323,541

(22) PCT Filed: Jan. 24, 2019

(86) PCT No.: PCT/CN2019/072900
§ 371 (c)(1),
(2) Date: Feb. 6, 2019

(87) PCT Pub. No.: WO2020/118877
PCT Pub. Date: Jun. 18, 2020

(65) Prior Publication Data
US 2020/0194717 A1 Jun. 18, 2020

(30) Foreign Application Priority Data
Dec. 13, 2018 (CN) .......................... 2018 1 1523410

(51) Int. Cl.
| | | |
|---|---|---|
| *H01L 29/08* | (2006.01) | |
| *H01L 35/24* | (2006.01) | |
| *H01L 51/00* | (2006.01) | |
| *H01L 51/52* | (2006.01) | |
| *H01L 27/32* | (2006.01) | |

(52) U.S. Cl.
CPC ...... *H01L 51/5253* (2013.01); *H01L 27/3246* (2013.01); *H01L 27/3283* (2013.01); *H01L 51/0097* (2013.01); *H01L 27/3211* (2013.01)

(58) Field of Classification Search
CPC ............. H01L 51/5253; H01L 51/0097; H01L 27/3246; H01L 27/3283; H01L 27/3211
See application file for complete search history.

(56) References Cited

U.S. PATENT DOCUMENTS

| | | | | |
|---|---|---|---|---|
| 2005/0112408 | A1* | 5/2005 | Kobayashi | .......... H01L 27/3246 428/690 |
| 2016/0240632 | A1* | 8/2016 | Satoh | ...................... H01L 29/41 |
| 2017/0077195 | A1 | 3/2017 | Seo et al. | |

FOREIGN PATENT DOCUMENTS

| | | |
|---|---|---|
| CN | 106654041 | 5/2017 |
| CN | 106910839 | 6/2017 |
| CN | 108735791 | 11/2018 |

* cited by examiner

*Primary Examiner* — Ismail A Muse

(57) ABSTRACT

An organic light emitting diode display device includes a flexible substrate, a pixel isolation layer, a plurality of pixels, a first inorganic encapsulation layer, a first organic encapsulation layer, and a second inorganic encapsulation layer. The pixel isolation layer is disposed on the flexible substrate. The pixels are disposed on the flexible substrate. The first inorganic encapsulation layer is disposed on the pixels and includes at least one stress adjustment layer. The first organic encapsulation layer is disposed on the first inorganic encapsulation layer. The second inorganic encapsulation layer is disposed on the first organic encapsulation layer and covers the first inorganic encapsulation layer.

14 Claims, 2 Drawing Sheets

ORGANIC LIGHT EMITTING DIODE DISPLAY DEVICE

RELATED APPLICATIONS

This application is a National Phase of PCT Patent Application No. PCT/CN2019/072900 having International filing date of Jan. 24, 2019, which claims the benefit of priority of Chinese Patent Application No. 201811523410.9 filed on Dec. 13, 2018. The contents of the above applications are all incorporated by reference as if fully set forth herein in their entirety.

FIELD AND BACKGROUND OF THE INVENTION

The present disclosure relates to the field of display technologies, and more particularly to an organic light emitting diode display device.

Organic light emitting diode (OLED) display devices, also known as organic electroluminescent display devices, are emerging flat panel display devices because of low power consumption, high luminance, light size, and fast response, easy to reach flexible display, and other advantages, and thus have broad application prospects.

However, in the prior art, a stress between an encapsulation layer and a luminescent film layer of the OLED display device is easily caused by bending or folding, which causes peeling between the encapsulation layer and the luminescent film layer, thereby reducing a performance of the OLED display device.

Therefore, there is a need to provide an organic light emitting diode display device to solve issues of the prior art.

SUMMARY OF THE INVENTION

To solve the above technical problem, the present disclosure provides an organic light emitting diode display device including a flexible substrate, a pixel isolation layer, a plurality of pixels, a first inorganic encapsulation layer, a first organic encapsulation layer, and a second inorganic encapsulation layer. The pixel isolation layer is disposed on the flexible substrate. The pixels are disposed on the flexible substrate. The first inorganic encapsulation layer is disposed on the pixels and includes at least one stress adjustment layer. The first organic encapsulation layer is disposed on the first inorganic encapsulation layer. The second inorganic encapsulation layer is disposed on the first organic encapsulation layer and covers the first inorganic encapsulation layer. A distance between two adjacent stress adjustment layers is greater than or equal to a length of one pixel. The pixel isolation layer includes a plurality of openings spaced apart from each other and a support portion disposed on both sides of each of the openings, and the at least one stress adjustment layer is disposed correspondingly above the support portion of the pixel isolation layer.

In an embodiment of the present disclosure, the at least one stress adjustment layer is a plurality of recesses disposed spaced apart from each other on the first inorganic encapsulation layer.

In an embodiment of the present disclosure, a thickness of each of the recesses is less than a thickness of the first inorganic encapsulation layer.

In an embodiment of the present disclosure, a thickness of each of the recesses ranges between 0.1 um and 1 um, and a width of each of the recesses ranges between 50 um and 1000 um.

In an embodiment of the present disclosure, a ratio of a width of each of the recesses to a thickness of each of the recesses ranges between 500 and 10000.

In an embodiment of the present disclosure, the recesses are equally spaced on the first inorganic encapsulation layer or a distance between adjacent two recesses is greater than or equal to one opening.

In an embodiment of the present disclosure, the organic light emitting diode display device further includes a blocking member disposed in the recesses.

In an embodiment of the present disclosure, a material of the blocking member includes Ag, Al, Ti, or a black organic polymer.

The present disclosure further provides an organic light emitting diode display device including a flexible substrate, a pixel isolation layer, a plurality of pixels, a first inorganic encapsulation layer, a first organic encapsulation layer, and a second inorganic encapsulation layer. The pixel isolation layer is disposed on the flexible substrate. The pixels are disposed on the flexible substrate. The first inorganic encapsulation layer is disposed on the pixels and includes at least one stress adjustment layer. The first organic encapsulation layer is disposed on the first inorganic encapsulation layer. The second inorganic encapsulation layer is disposed on the first organic encapsulation layer and covers the first inorganic encapsulation layer.

In an embodiment of the present disclosure, a distance between two adjacent stress adjustment layers is greater than or equal to a length of one pixel.

In an embodiment of the present disclosure, the pixel isolation layer includes a plurality of openings spaced apart from each other and a support portion disposed on both sides of each of the openings, and the at least one stress adjustment layer is disposed correspondingly above the support portion of the pixel isolation layer.

In an embodiment of the present disclosure, the at least one stress adjustment layer is a plurality of recesses disposed spaced apart from each other on the first inorganic encapsulation layer.

In an embodiment of the present disclosure, a thickness of each of the recesses is less than a thickness of the first inorganic encapsulation layer.

In an embodiment of the present disclosure, a thickness of each of the recesses ranges between 0.1 um and 1 um, and a width of each of the recesses ranges between 50 um and 1000 um.

In an embodiment of the present disclosure, a ratio of a width of each of the recesses to a thickness of each of the recesses ranges between 500 and 10000.

In an embodiment of the present disclosure, the recesses are equally spaced on the first inorganic encapsulation layer or a distance between adjacent two recesses is greater than or equal to one opening.

In an embodiment of the present disclosure, the organic light emitting diode display device further includes a blocking member disposed in the recesses.

In an embodiment of the present disclosure, a material of the blocking member includes Ag, Al, Ti, or a black organic polymer.

Compared with the prior art, in order to solve the above technical problem, in the organic light emitting diode display device of the embodiment of the present disclosure, the first inorganic encapsulation layer includes at least one stress adjustment layer, which can effectively reduce a peeling between the organic light emitting layer of the pixels and the first inorganic encapsulation layer caused by a folding process, this also improves a performance of the organic light emitting diode display device.

BRIEF DESCRIPTION THE SEVERAL VIEWS OF THE DRAWINGS

DESCRIPTION OF SPECIFIC EMBODIMENTS OF THE INVENTION

Figure 1:
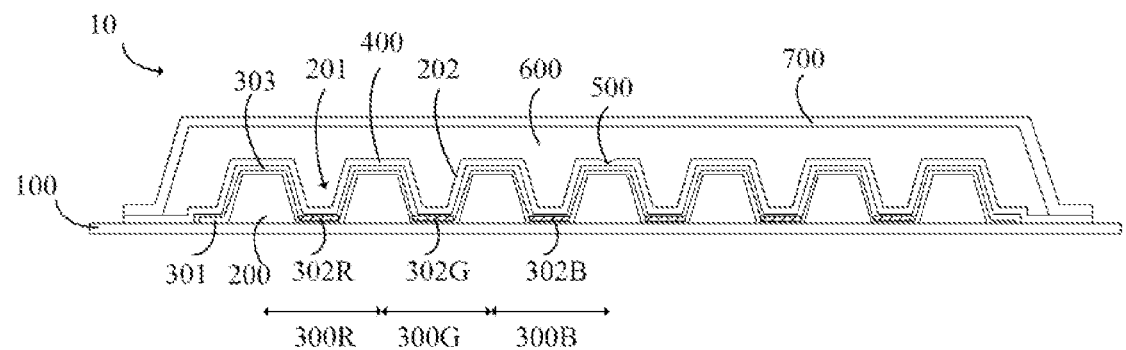
FIG. 1 is a schematic structural diagram of an organic light emitting diode display device according to an embodiment of the present disclosure.

The following description of the various embodiments is provided to illustrate the specific embodiments with reference to the accompanying drawings.

In order to make the above description of the present disclosure and other objects, features, and advantages of the present disclosure more comprehensible, preferred embodiments are described below, and are described in detail below with reference to the accompanying drawings. Furthermore, directional terms described by the present disclosure, such as up, down, top, bottom, front, back, left, right, inner, outer, side, surrounding, center, horizontal, vertical, longitudinal, axial, radial, uppermost or lowermost, etc., are only directions by referring to the accompanying drawings, and thus the used terms are used only for the purpose of describing embodiments of the present disclosure and are not intended to be limiting of the present disclosure.

In the drawings, units with similar structures are labeled with the same reference number.

Figure 2:
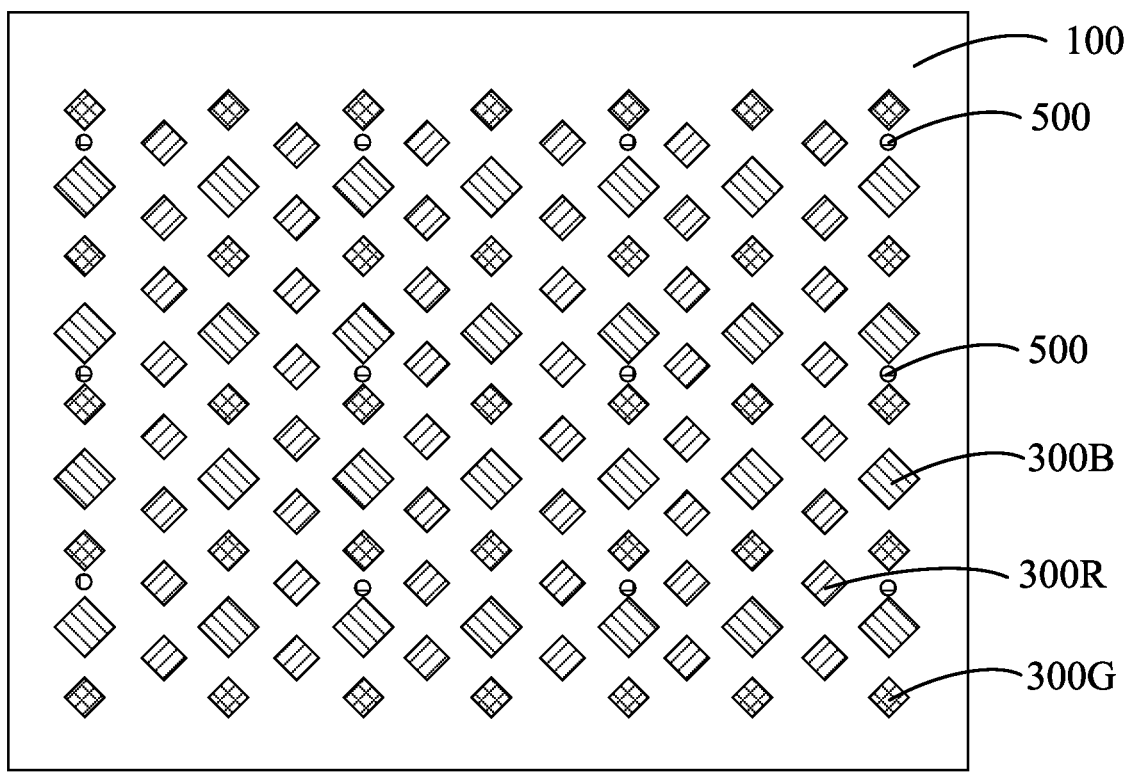
FIG. 2 is a schematic diagram illustrating a configuration of a pixel isolation layer, a pixel region, and a stress adjustment layer according to an embodiment of the present disclosure.

Referring to FIGS. 1 and 2, an organic light emitting diode display device 10 of an embodiment of the present disclosure includes a flexible substrate 100, a pixel isolation layer 200, a plurality of pixels 300R, 300G, 300B, a first inorganic encapsulation layer 400, a first organic encapsulation layer 600, and a second inorganic encapsulation layer 700. The pixel isolation layer 200 is disposed on the flexible substrate 100. The pixels 300R, 300G, 300B are disposed on the flexible substrate 100. The first inorganic encapsulation layer 400 is disposed on the pixels 300R, 300G, 300B and includes at least one stress adjustment layer 500. The first organic encapsulation layer 600 is disposed on the first inorganic encapsulation layer 400. The second inorganic encapsulation layer 700 is disposed on the first organic encapsulation layer 600 and covers the first inorganic encapsulation layer 400. The at least one stress adjustment layer 500 can effectively reduce a peeling between the organic light emitting layer of the pixels 300R, 300G, 300B and the first inorganic encapsulation layer 400 caused by a folding process, this also improves a performance of the organic light emitting diode display device 10.

In the organic light emitting diode display device 10 of the embodiment of the present disclosure, the first inorganic encapsulation layer 400 is divided into a plurality of regions by the at least one stress adjustment layer 500, this can effectively reduce a peeling between the organic light emitting layer of the pixels 300R, 300G, 300B and the first inorganic encapsulation layer 400 caused by a folding process, this also improves a performance of the organic light emitting diode display device 10. The regionalization of such a first inorganic encapsulation layer 400 can be achieved by a mask design.

In details, the pixels 300R, 300G, 300B include an anode (also referred to as a pixel electrode) 301, an organic light emitting layer 302R, 302G, 302B, and a cathode 303 which are sequentially disposed. The organic light emitting layer 302R, 302G, 302B is disposed on a region of the anode 301 exposed by the pixel isolation layer 200. The pixel isolation layer 200 is disposed on the flexible substrate 100 to overlap an upper portion of an edge of the anode 301. The cathode 303 is disposed on the organic light emitting layers 302R, 302G, and 302B and is made of a transparent material. The cathode 303 is disposed on substantially an entire upper side of the pixels 300R, 300G, 300B.

In details, the organic light emitting layer 302R, 302G, 302B may be formed in the form of a red light emitting layer 302R, a green light emitting layer 302G, or a blue light emitting layer 302B. The red light emitting layer 302R, the green light emitting layer 302G, or the blue light emitting layer 302B is separately deposited by using a fine metal mask. The pixels 300R, 300G, 300B may be classified into a red pixel 300R, a green pixel 300G, or a blue pixel 300B according to types of the organic light emitting layers 302R, 302G, 302B.

In details, the pixels 300R, 300G, 300B include the cathode 303 made of a transparent material to emit light toward the cathode 303. Therefore, the organic light emitting diode display device 10 can be implemented as a top emission (or double side emission) organic light emitting display device. In the depicted embodiment, the cathode 303 is a common electrode shared by all of the pixels 300R, 300G, 300B. However, each of the pixels may also each have a cathode to electrically connect with the cathodes of the other pixels.

Because the cathode 303 can transmit light in the top emission or double-sided emission organic light-emitting display device, the cathode 303 is made of a transparent conductive layer. The cathode 303 is made of, for example, indium tin oxide ITO).

In details, the organic light emitting diode display device 10 can be applied to, for example, an electronic product such as a mobile phone or a television.

In details, a distance between two adjacent stress adjustment layers 500 is greater than or equal to a length of one pixel 300R, 300G, or 300B (as illustrated in FIG. 2).

In details, the pixel isolation layer 200 includes a plurality of openings 201 spaced apart from each other and a support portion 202 disposed on both sides of each of the openings 201, and the at least one stress adjustment layer 500 is disposed correspondingly above the support portion 202 of the pixel isolation layer 200.

In details, the at least one stress adjustment layer 500 is a plurality of recesses disposed spaced apart from each other on the first inorganic encapsulation layer 400. A thickness of each of the recesses is less than a thickness of the first inorganic encapsulation layer 400. A thickness of each of the recesses ranges between 0.1 um and 1 um, and a width of each of the recesses ranges between 50 um and 1000 um. A ratio of a width of each of the recesses to a thickness of each of the recesses ranges between 500 and 10000. The recesses are equally spaced on the first inorganic encapsulation layer 400 or a distance between adjacent two recesses is greater than or equal to one opening 201.

Figure 3:
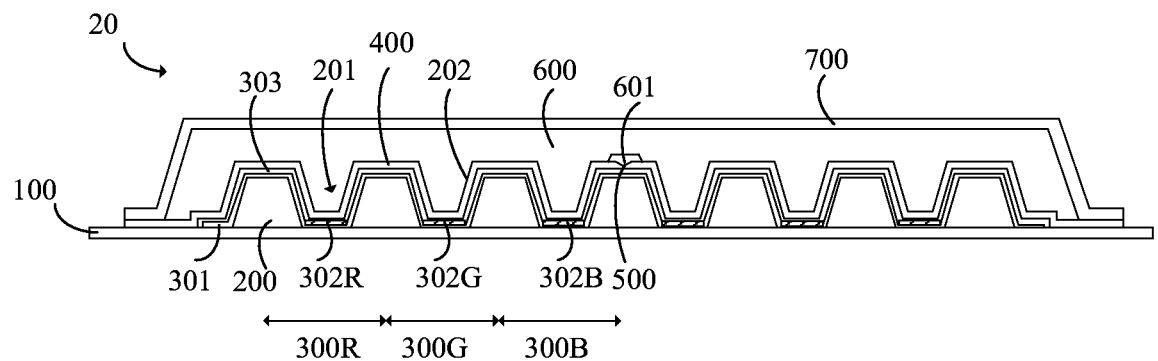
FIG. 3 is a schematic structural diagram of an organic light emitting diode display device according to an embodiment of the present disclosure.
Figure 4:
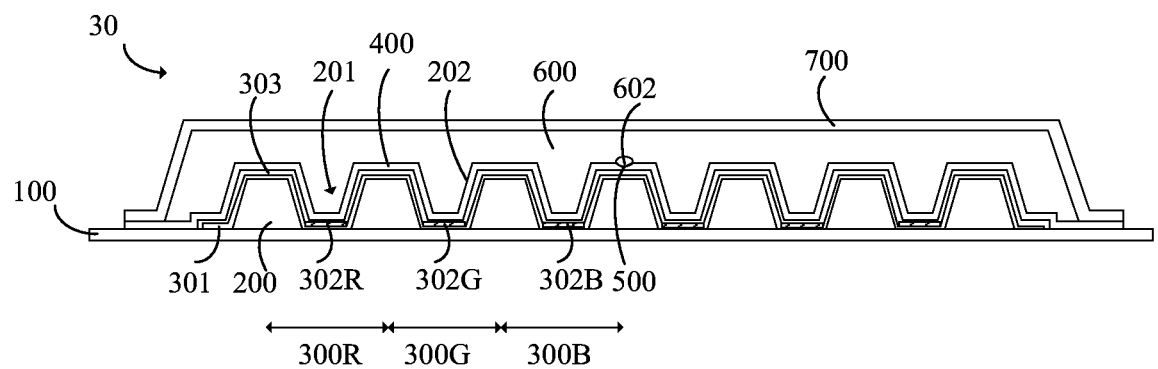
FIG. 4 is a schematic structural diagram of an organic light emitting diode display device according to an embodiment of the present disclosure.

In details, the organic light emitting diode display device 10 further includes a blocking member 601, 602 disposed in the recesses (illustrated in FIGS. 3 and 4). A material of the blocking member 601, 602 includes Ag, Al, Ti, or a black organic polymer.

As illustrated in FIGS. 1 and 2, in details, in a first direction (such as a vertical direction), a first distance between two adjacent stress adjustment layers 500 is greater than lengths of two blue pixels 300B and one green pixel 300G. In the first direction, a second distance between the adjacent two stress adjustment layers 500 is greater than lengths of one blue pixel 300B and two green pixels 300G. The first distance between the adjacent two stress adjustment layers 500 is greater than the second distance between the adjacent two stress adjustment layers 500.

In details, in a second direction (such as a horizontal direction), a distance between adjacent two stress adjustment layers 500 is greater than lengths of two blue pixels 300B and two red pixels 300R.

In details, in the second direction, a distance between all adjacent two stress adjustment layers 500 is greater than lengths of two blue pixels 300B and two red pixels 300R.

In details, a material of the flexible substrate 100 may be polyvinyl alcohol, polyimide, polyester, or the like. A material of the first inorganic encapsulation layer 400 is selected from the group consisting of SiNx, SiOx, SiONx, SiCNx, $Al_2O_3$, TiO2, ZrO2, or a combination thereof. A thickness of the first inorganic encapsulation layer 400 ranges between 0.5 um and 1.5 um.

In details, a material of the first organic encapsulation layer 600 includes an acrylic series, an epoxy series, or a silicone series. A thickness of the first organic encapsulation layer 600 ranges between 4 um and 20 um.

Referring to FIG. 3, in an embodiment, a blocking member 601 is disposed in recesses 500 of an organic light emitting diode display device 20. A material of the blocking member 601 is, for example, a metal-based material that is not easily oxidized, including Ag, Al, or Ti, which improves a performance of the first organic encapsulation layer 600 from water oxygen. Referring to FIG. 4, in another embodiment, a blocking member 602 is disposed in the recesses 500 of an organic light emitting diode display device 30. A material of the blocking member 602 includes a black organic polymer for preventing adjacent pixels from being mixed, thereby improving a contrast of the organic light emitting diode display device 30.

In details, a width of the at least one stress adjustment layer 500 ranges between 50 um and 1000 um. A thickness of the at least one stress adjustment layer 500 ranges between 0.1 um and 1 um. A ratio of the width of the at least one stress adjustment layer 500 to the thickness of the at least one stress adjustment layer 500 ranges between 500 and 10000. The thickness of the at least one stress adjustment layer 500 is less than the thickness of the first inorganic encapsulation layer 400. The at least one stress adjustment layer 500 may include, for example, a circular hole, a groove, or the like.

In details, a material of the second inorganic encapsulation layer 700 may be same as a material of the first inorganic encapsulation layer 400. The second inorganic encapsulation layer 700 may completely cover the first inorganic encapsulation layer 400. A length of the second inorganic encapsulation layer 700 may also be same as a length of the first inorganic encapsulation layer 400.

In the organic light emitting diode display device of the embodiment of the present disclosure, the first inorganic encapsulation layer includes at least one stress adjustment layer, which can effectively reduce a peeling between the organic light emitting layer of the pixels and the first inorganic encapsulation layer caused by a folding process, this also improves a performance of the organic light emitting diode display device.

Further, the first inorganic encapsulation layer is divided into a plurality of regions by the at least one stress adjustment layer, this can effectively reduce a peeling between the organic light emitting layer of the pixels and the first inorganic encapsulation layer caused by a folding process, this also improves a performance of the organic light emitting diode display device. The regionalized design of a package structure of the organic light emitting diode display device effectively reduces the stress generated by a bending or folding process between the organic light emitting layer and the first inorganic encapsulation layer, and improves reliability of the organic light emitting diode display device.

Although the present disclosure is described via one or more embodiments, those of ordinary skill in the art can come up with equivalent variations and modifications based upon the understanding of the specification and the accompanying drawings. The present disclosure includes all such modifications and variations, and is only limited by the scope of the appended claims. In particular, as to the various functions performed by the components described above, the terms used to describe the components are intended to correspond to any component performing the specific functions (e.g., which are functionally equivalent) of the components (unless otherwise indicated), even those which are structurally different from the disclosed structure for performing the functions in the exemplary embodiments in the specification shown herein. In addition, although a particular feature in the specification is disclosed in only one of many embodiments, this feature may be combined with one or more features in other embodiments which are desirable and advantageous to a given or particular application. Moreover, the terms "include", "have", "consist of", or variations thereof used in the detailed description or the claims are intended to be used in a manner similar to the term "comprising".

In summary, although the preferable embodiments of the present disclosure have been disclosed above. It should be noted that those of ordinary skill in the art can make a variety of improvements and substitutions on the premise of not deviating from the technical principle of the present disclosure, and these improvements and substitutions should be encompassed within the protection scope of the present disclosure.

What is claimed is:

1. An organic light emitting diode display device, comprising:
    a flexible substrate;
    a pixel isolation layer disposed on the flexible substrate;
    a plurality of pixels disposed on the flexible substrate;
    a first inorganic encapsulation layer disposed on the pixels, wherein the first inorganic encapsulation layer comprises at least one stress adjustment recess;
    a first organic encapsulation layer disposed on the first inorganic encapsulation layer; and
    a second inorganic encapsulation layer disposed on the first organic encapsulation layer and covering the first inorganic encapsulation layer; and
    a blocking member;
    wherein a distance between two adjacent stress adjustment recesses is greater than or equal to a length of one pixel;

wherein the pixel isolation layer comprises a plurality of openings spaced apart from each other and a support portion disposed on both sides of each of the openings, and the at least one stress adjustment recess is disposed correspondingly above the support portion of the pixel isolation layer;

wherein the at least one stress adjustment recess is a plurality of recesses disposed spaced apart from each other on the first inorganic encapsulation layer; and wherein the blocking member is disposed in the recesses.

2. The organic light emitting diode display device according to claim 1, wherein a thickness of each of the recesses is less than a thickness of the first inorganic encapsulation layer.

3. The organic light emitting diode display device according to claim 1, wherein a thickness of each of the recesses ranges between 0.1 um and 1 um, and a width of each of the recesses ranges between 50 um and 1000 um.

4. The organic light emitting diode display device according to claim 1, wherein a ratio of a width of each of the recesses to a thickness of each of the recesses ranges between 500 and 10000.

5. The organic light emitting diode display device according to claim 1. wherein the recesses are equally spaced on the first inorganic encapsulation layer or a distance between adjacent two recesses is greater than or equal to one opening.

6. The organic light emitting diode display device according to claim 1, wherein a material of the blocking member comprises Ag, Al, Ti, or a black organic polymer.

7. An organic light emitting diode display device, comprising:
a flexible substrate:
a pixel isolation layer disposed on the flexible substrate;
a plurality of pixels disposed on the flexible substrate;
a first inorganic encapsulation layer disposed on the pixels, wherein the first inorganic encapsulation layer comprises at least one stress adjustment recess;
a first organic encapsulation layer disposed on the first inorganic encapsulation layer; and
a second inorganic encapsulation layer disposed on the first organic encapsulation layer and covering the first inorganic encapsulation layer and
a blocking member;
wherein the at least one stress adjustment recess is a plurality of recesses disposed spaced apart from each other on the first inorganic encapsulation layer; and
wherein the blocking member is disposed in the recesses.

8. The organic light emitting diode display device according to claim 7, wherein a distance between two adjacent stress adjustment layers recesses is greater than or equal to a length of one pixel.

9. The organic light emitting diode display device according to claim 7, wherein the pixel isolation layer comprises a plurality of openings spaced apart from each other and a support portion disposed on both sides of each of the openings, and the at least one stress adjustment recess is disposed correspondingly above the support portion of the pixel isolation layer.

10. The organic light emitting diode display device according to claim 7, wherein a thickness of each of the recesses is less than a thickness of the first inorganic encapsulation layer.

11. The organic light emitting diode display device according to claim 7, wherein a thickness of each of the recesses ranges between 0.1 um and 1 um, and a width of each of the recesses ranges between 50 um and 1000 um.

12. The organic light emitting diode display device according to claim 7, wherein a ratio of a width of each of the recesses to a thickness of each of the recesses ranges between 500 and 10000.

13. The organic light emitting diode display device according to claim 7, wherein the recesses are equally spaced on the first inorganic encapsulation layer or a distance between adjacent two recesses is greater than or equal to one opening.

14. The organic light emitting diode display device according to claim 7, wherein a material of the blocking member comprises Ag, Al, Ti, or a black organic polymer.

* * * * *